(12) United States Patent
Ouderkirk et al.

(10) Patent No.: US 7,304,425 B2
(45) Date of Patent: Dec. 4, 2007

(54) HIGH BRIGHTNESS LED PACKAGE WITH COMPOUND OPTICAL ELEMENT(S)

(75) Inventors: Andrew J. Ouderkirk, Woodbury, MN (US); Catherine A. Leatherdale, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 346 days.

(21) Appl. No.: 10/977,225

(22) Filed: Oct. 29, 2004

(65) Prior Publication Data

US 2006/0091798 A1    May 4, 2006

(51) Int. Cl.
*H01J 5/16* (2006.01)
*H01J 61/40* (2006.01)

(52) U.S. Cl. ............ 313/501; 313/512; 313/110; 313/112; 313/113; 385/123; 385/124; 362/555; 362/800; 257/98; 257/100

(58) Field of Classification Search ........ 313/110–114, 313/501–512; 257/98, 100; 362/555, 800; 385/123, 124
See application file for complete search history.

(56) References Cited

U.S. PATENT DOCUMENTS

| | | | |
|---|---|---|---|
| 3,756,688 A * | 9/1973 | Hudson et al. ............... | 385/43 |
| 4,009,394 A * | 2/1977 | Mierzwinski ............... | 313/512 |
| 5,255,171 A | 10/1993 | Clark | |
| 5,403,773 A | 4/1995 | Nitta et al. | |
| 5,698,452 A | 12/1997 | Goosen | |
| 5,724,376 A | 3/1998 | Kish, Jr. et al. | |
| 5,793,062 A | 8/1998 | Kish, Jr. et al. | |
| 5,915,193 A | 6/1999 | Tong et al. | |
| 5,925,898 A | 7/1999 | Spath | |
| 6,091,694 A | 7/2000 | Spath | |
| 6,429,462 B1 | 8/2002 | Shveykin | |
| 6,476,551 B1 | 11/2002 | Osawa et al. | |
| 6,483,196 B1 | 11/2002 | Wojnarowski et al. | |
| 6,501,091 B1 | 12/2002 | Bawendi et al. | |
| 6,563,133 B1 | 5/2003 | Tong | |

(Continued)

FOREIGN PATENT DOCUMENTS

EP     563991 A2 * 10/1993

(Continued)

OTHER PUBLICATIONS

N. Goodman, R. Ignatius, L. Wharton, and R. Winston, "Solid-dielectric compound parabolic concentrators: on their use with photovoltaic devices", Applied Optics, vol. 15, No. 10, Oct. 1976, pp. 2434-2436.

(Continued)

*Primary Examiner*—Mariceli Santiago
(74) *Attorney, Agent, or Firm*—Jay R. Pralle

(57) ABSTRACT

A light source includes an LED die with an emitting surface and a collimating optical element. The optical element includes an input surface in optical contact with the LED emitting surface, and an output surface. The optical element has a first portion that comprises the input surface, made of a first optical material, and a second portion that comprises the output surface, made of a second optical material. The first optical material, which may include sapphire, diamond, or silicon carbide, has a higher refractive index, thermal conductivity, or both relative to the second optical material.

9 Claims, 5 Drawing Sheets

U.S. PATENT DOCUMENTS

| | | | |
|---|---|---|---|
| 6,603,149 B2 * | 8/2003 | Budd et al. | 257/98 |
| 6,819,505 B1 * | 11/2004 | Cassarly et al. | 359/726 |
| 6,896,381 B2 * | 5/2005 | Benitez et al. | 359/858 |
| 7,073,931 B2 * | 7/2006 | Ishida | 362/539 |
| 7,111,964 B2 * | 9/2006 | Suehiro et al. | 257/98 |
| 2002/0030194 A1 | 3/2002 | Camras et al. | |
| 2003/0111667 A1 | 6/2003 | Schubert | |
| 2003/0227249 A1 | 12/2003 | Mueller et al. | |
| 2003/0231497 A1 | 12/2003 | Sakata et al. | |
| 2004/0046179 A1 | 3/2004 | Baur et al. | |
| 2004/0051106 A1 | 3/2004 | Baur et al. | |
| 2004/0079942 A1 | 4/2004 | Steranka et al. | |
| 2004/0080251 A1 | 4/2004 | Steranka et al. | |
| 2004/0150991 A1 | 8/2004 | Ouderkirk et al. | |
| 2004/0164311 A1 | 8/2004 | Uemura | |
| 2004/0232812 A1 | 11/2004 | Beeson et al. | |
| 2004/0264185 A1 | 12/2004 | Grotsch et al. | |
| 2005/0023545 A1 | 2/2005 | Camras et al. | |
| 2005/0213310 A1 | 9/2005 | Takeda | |
| 2005/0243570 A1 | 11/2005 | Chaves et al. | |

FOREIGN PATENT DOCUMENTS

| | | | |
|---|---|---|---|
| GB | 1 409 793 | | 10/1975 |
| GB | 2 378 576 | | 2/2003 |
| JP | 61096780 A | * | 5/1986 |
| JP | 2003006506 | | 3/1991 |
| JP | 9-167515 | | 6/1997 |
| JP | 2001250986 A | * | 9/2001 |
| JP | 2002228921 A | * | 8/2002 |
| WO | WO 01/41225 | | 6/2001 |
| WO | WO 02/07228 | | 1/2002 |
| WO | WO 03/069685 | | 8/2003 |
| WO | WO 2003069685 A2 | * | 8/2003 |
| WO | WO 04/040346 | | 4/2004 |
| WO | WO 2004/068183 | | 8/2004 |
| WO | WO 2004/068602 | | 8/2004 |
| WO | WO 2004/068603 | | 8/2004 |

OTHER PUBLICATIONS

Q. -Y. Tong and U. Gosele, Chapters 4 and 10, "Semiconductor Wafer Bonding", John Wiley & Sons, New York, 1999, Table of Contents, pp. 49-101, and pp. 223-232.

U.S. Application entitled "Process for Manufacturing Optical and Semiconductor Elements", filed on Oct. 29, 2004, having U.S. Appl. No. 10/977,239.

U.S. Application entitled "Process for Manufacturing a Light Emitting Array", filed on Oct. 29, 2004, having U.S. Appl. No. 10/977,240.

U.S. Application entitled "LED Package With Front Surface Heat Extractor", filed on Oct. 29, having U.S. Appl. No. 10/977,241.

U.S. Application entitled "High Brightness LED Package With Multiple Optical Elements", filed on Oct. 29, 2004, having U.S. Appl. No. 10/977,248.

U.S. Application entitled "LED Package With Non-Bonded Optical Element", filed on Oct. 29, 2004, having U.S. Appl. No. 10/977,249.

U.S. Application entitled "High Brightness LED Package", filed on Oct. 29, 2004, having U.S. Appl. No. 10/977,577.

U.S. Application entitled "LED Array Systems", filed on Jun. 1, 2004, having U.S. Appl. No. 10/858,539.

U.S. Application entitled "Reshaping Light Source Modules and Illumination Systems Using the Same", filed on Feb. 11, 2004, having U.S. Appl. No. 10/776,155.

U.S. Application entitled "Polarized LED", filed on Oct. 29, 2004, having U.S. Appl. No. 10/977,582.

U.S. Application entitled "Reflective Light Coupler", filed on Dec. 2, 2003, having U.S. Appl. No. 10/726,244.

* cited by examiner

HIGH BRIGHTNESS LED PACKAGE WITH COMPOUND OPTICAL ELEMENT(S)

CROSS REFERENCE TO RELATED APPLICATIONS

The present application relates generally to the following co-filed and commonly assigned U.S. patent applications: "High Brightness LED Package", Ser. No. 10/977,577; "High Brightness LED Package With Multiple Optical Elements", Ser. No. 10/977,248.

FIELD OF THE INVENTION

The present invention relates to solid state light sources, and has particular applicability in the field of packaged light emitting diodes (LEDs).

BACKGROUND

LEDs are a desirable choice of light source in part because of their relatively small size, low power/current requirements, high speed, long life, robust packaging, variety of available output wavelengths, and compatibility with modern circuit boards. These characteristics may help explain their widespread use over the past few decades in a multitude of different end use applications. Improvements to LEDs continue to be made in the areas of efficiency, brightness, and output wavelength, further enlarging the scope of potential end-use applications.

LEDs are typically sold in a packaged form that includes an LED die or chip mounted on a metal header. The header has a reflective cup in which the LED die is mounted, and electrical leads connected to the LED die. The package further includes a molded transparent resin that encapsulates the LED die. The encapsulating resin typically has a nominally hemispherical front surface to partially collimate light emitted from the LED die.

BRIEF SUMMARY

The present application discloses packaged solid state light sources that utilize LED dies. The LED die has at least one emitting surface that is in optical contact with at least one collimating optical element such as a tapered element or lens element. The optical elements or element has an input surface and an output surface, and is divided into at least a first and second portion, where the first portion comprises the input surface and the second portion comprises the output surface. The first and second portions comprise a first and second optical material, respectively, where the first optical material has a refractive index and/or thermal conductivity greater than that of the second optical material. The first optical material can comprise a physically hard, transparent inorganic material, such as sapphire, diamond, or silicon carbide.

These and other aspects of the invention will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

Throughout the specification, reference is made to the appended drawings, where like reference numerals designate like elements, and wherein.

DETAILED DESCRIPTION OF THE ILLUSTRATIVE EMBODIMENTS

One disadvantage of conventional LED packages described in the Background section above is the inefficiency in getting the light that is generated within the LED die transmitted to the outside environment, typically air. A major reason for this inefficiency is the high refractive index of the semiconductor layers of the LED die, and the large mismatch in refractive index between the encapsulating resin and the outer portion (defining the emitting surface) of the LED die. This mismatch promotes total internal reflection (TIR) of much of the light within the LED die, causing such light to become trapped and eventually absorbed.

Another disadvantage of the typical LED package relates to poor heat management of the LED die, which unduly limits the amount of current that can flow through the diode junction of the LED. This in turn limits the achievable brightness and luminous output of the LED package. Poor heat management, which refers to non-optimal heat removal from the LED die, also can adversely impact LED lifetime by causing the LED die to run hotter at a given current than desired. In the known LED package described above, bonding of the LED die to the metal header provides reasonable heat removal from the back of the LED die. However, the front emitting surface of the LED die contacts the encapsulating resin, which has a low thermal conductivity and thus removes a minimal heat from the LED die.

It would be desirable for many end-use applications to provide LED package improvements that could couple more of the light generated within the LED die to the outside environment, thus enhancing the luminous output of the device. It would also be desirable to provide LED package improvements that could enhance the brightness of an LED die (at a given drive current). It would also be desirable to provide LED package improvements that could enhance the thermal management of the LED die to provide cooler LED die operational temperatures and/or higher achievable LED drive currents.

In the text that follows, LED packages that use at least one compound optical element in optical contact with the LED die, and advantages associated therewith, are disclosed amidst a discussion of related embodiments that may not require compound optical elements. This is so that the reader will more fully appreciate design details and variations of the claimed invention.

Figure 1:
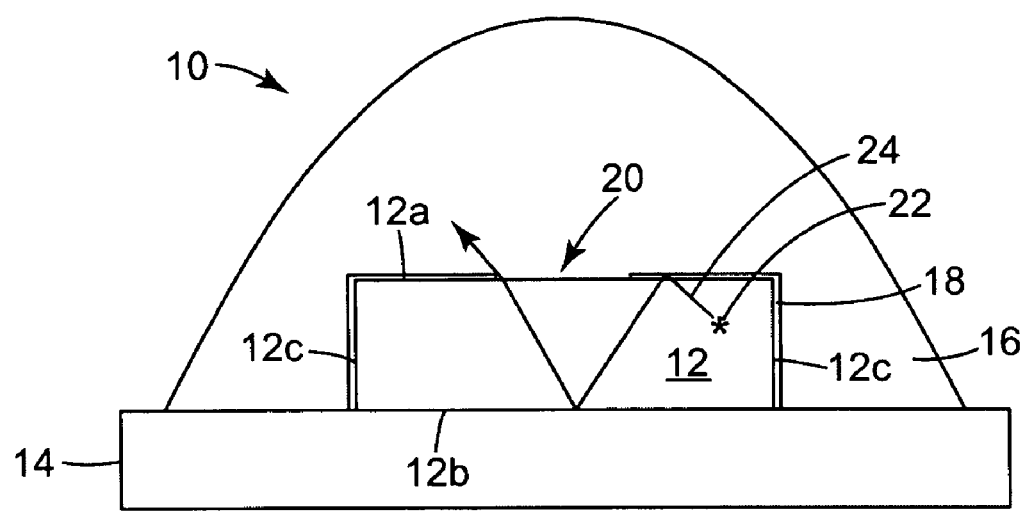
FIGS. 1 and 2 are schematic sectional views of LED packages having a brightness enhancing layer.

In FIG. 1, an LED package 10 includes an LED die 12 mounted on a header or other mount 14. The die and mount are depicted generically for simplicity, but the reader will understand that they can include conventional design features as are known in the art. For example, the LED die 12 can include distinct p- and n-doped semiconductor layers, substrate layers, buffer layers, and superstrate layers. The primary emitting surface 12a, bottom surface 12b, and side surfaces 12c of the LED die are shown in a simple rectangular arrangement, but other known configurations are also contemplated, e.g., angled side surfaces forming an inverted truncated pyramid shape. Electrical contacts to the LED die are also not shown for simplicity, but can be provided on any of the surfaces of the die as is known. In exemplary embodiments the die has two contacts both disposed at the bottom surface 12b of the die, such as is the case with "flip chip" LED die designs. Further, mount 14 can serve as a support substrate, electrical contact, heat sink, and/or reflector cup.

LED package 10 also includes a transparent optical element 16 that encapsulates or surrounds the die 12. The optical element 16 has a refractive index intermediate that of the LED die (more precisely, the outer portion of the LED die proximate emitting surface 12a) and the surrounding medium, which is ordinarily air. In many embodiments it is desirable to select a material for element 16 whose refractive index is as high as possible but without substantially exceeding the refractive index of the LED die, since the smaller the difference in refractive index between the LED die and the element 16, the less light is trapped and lost within the die. Optical element 16 as shown has a curved output surface, which can help ensure that light is transmitted out of the LED package to the surrounding medium, and can also be used to focus or collimate, at least partially, light emitted by the LED die. Optical elements having other shapes can also be used to collimate light, including tapered shapes discussed further below.

LED package 10 is further provided with a patterned low refractive index layer 18 between the optical element 16 and the die, which has the effect of selectively preserving some light entrapment in the LED die in order to enhance the brightness in a localized aperture or area 20 at the emitting surface 12a. Patterned low index layer 18 is in substantial optical contact with side surfaces 12c and the portion of emitting surface 12a exclusive of aperture 20, while the optical element 16 is in optical contact with the portion of emitting surface 12a over the area of the aperture 20. (In this regard, "optical contact" refers to the surfaces or media being spaced close enough together, including but not limited to being in direct physical contact, that the refractive index properties of the low index layer or transparent element, for example, control or substantially influence total internal reflection of at least some light propagating within the LED die.) Patterned low index layer 18 has a refractive index substantially lower than both the refractive index of the LED die and the refractive index of transparent element 16. Layer 18 is also optically thick in those places where it is intended to promote light trapping. By optically thick, we mean that its thickness is great enough to avoid frustrated total internal reflection, or that the refractive index properties of the medium on one side of the layer (such as the optical element 16) do not control or substantially influence total internal reflection of at least some light propagating in the medium on the other side of the layer (such as the LED 12). Preferably, the thickness of the patterned low index layer is greater than about one-tenth, more preferably one-half, more preferably about one wavelength for the energy of light of interest in vacuum. By "patterning" of layer 18 we also mean to encompass embodiments where layer 18 is continuous over the LED emitting surface, but made to be extremely thin (hence ineffective to maintain total internal reflection) in the aperture 20 and optically thick elsewhere.

It is advantageous for layer 18 to be a transparent dielectric material, or to at least comprise a layer of such a material at the surface of the LED die. These materials have advantages over reflective coatings made by simply applying a layer of metal to the LED, for example, because dielectric materials can provide 100% reflection (by TIR) for much of the light within the LED die, while simple metal coatings have substantially less than 100% reflectivity, particularly at high incidence angles.

Patterned low index layer 18 enhances the brightness of some portions of the LED (e.g., in the aperture 20) at the expense of reducing the brightness of other portions of the LED (e.g., the portions of emitting surface 12a beyond aperture 20). This effect relies on the LED die having low enough internal losses during operation to support multiple bounce reflections of the emitted light within the LED die. As advances are made in LED die fabrication and design, losses from surface or volumetric absorption can be expected to decrease, internal quantum efficiency can be expected to increase, and brightness-enhancing effect described herein can be expected to provide steadily increasing benefits. Bulk absorption can be reduced by improving substrates and epitaxial deposition processes. Surface absorption can be reduced by improved back reflectors such as by bonding the epitaxial layer to high reflectivity metal mirrors or by incorporating omnidirectional mirrors in the LED structure. Such designs may be more effective when combined with shaping the backside of the LED die to increase light output through the top surface. In exemplary embodiments, the majority of the bottom surface 12b is a highly reflective material such as a metal or a dielectric stack. Preferably the reflector has greater than 90% reflectivity, more preferably 95%, most preferably 99% reflectivity at the LED emission wavelength.

Referring again to FIG. 1, an arbitrary emitting point source 22, for example, emits light ray 24. The refractive indices of LED die 12 and transparent element 16 are such that the ray on its first encounter with the emitting surface 12a at the LED/optical element interface would be transmitted into and refracted by element 16. Patterned layer 18, however, changes the interface at that location to be totally internally reflecting for ray 24. The ray travels through the thickness of the LED die, reflects off the back surface 12b, and again encounters the emitting surface 12a, this time escaping into transparent element 16 because of the absence of layer 18 as shown in FIG. 1. The portion of emitting surface 12a at aperture 20 is thus made brighter (more luminous flux per unit area and per unit solid angle) at the expense of the portion of emitting surface 12a covered by the low index layer 18.

In the embodiment of FIG. 1, some light within the LED that strikes the low index layer 18 can still escape into element 16, if its angle of incidence relative to the emitting surface 12a normal vector is sufficiently small so that it simply passes through low index layer 18. Thus, light striking the low index coated portion of the LED die will have a non-zero but smaller range of escape angles than the uncoated portions. In alternative embodiments, the low index layer 18 can be overcoated with a good normal-incidence reflector such as a reflective metal or an interference reflector to increase recycling of light in the LED die and further enhance the brightness at aperture 20, without losing the benefit of TIR provided by low index layer 18. Optionally, an interference reflector can be positioned between the outer die surface and the low index layer 18.

Suitable low index layers 18 include coatings of magnesium fluoride, calcium fluoride, silica, sol gels, fluorocarbons, and silicones. Aerogel materials are also suitable, as they can achieve extremely low effective refractive indices of about 1.2 or less, or even about 1.1 or less. Aerogels are made by high temperature and pressure critical point drying of a gel composed of colloidal silica structural units filled with solvents. The resulting material is an underdense, microporous media. Exemplary thicknesses for the low index layer 18 are from about 50 to 100,000 nm, preferably from about 200 to 2000 nm, depending on the refractive index of the material. The refractive index of layer 18 is below the refractive index of the optical element 16, which can be a molded resin or other encapsulant material, and below the refractive index of the LED die, or that portion of the die proximate the emitting surface(s). Preferably the refractive index of layer 18 is less than about 1.5, more preferably less than 1.4. Low index layer 18 can be a solid layer of dielectric material, or a vacuum or gas-filled gap between the LED die and transparent element 16.

The outer surfaces of the LED die can be optically smooth, i.e., having a surface finish $R_A$ of less than about 20 nm. Some, all, or portions of the outer LED surfaces may also be optically rough, i.e., having a surface finish $R_A$ greater than about 20 nm. Portions of the edges or the top surface can also be at non-orthogonal angles relative to the base of the LED die. These angles can range from 0-45 degrees from orthogonality. Further, major or minor surfaces of the LED die need not be flat. For example, a raised portion or portions of the emitting surface of the LED die can contact a generally flat bottom surface of the optical element to define at least the apertures 20, 20a, and 34 in FIGS. 1-3.

The shape of aperture 20, defined by the substantial absence of the low index layer 18, can be circular, rectangular, square, or more complex shapes, whether polygonal or non-polygonal, regular or irregular. Multiple apertures are also contemplated, as discussed in more detail below. The aperture shape(s) will typically be selected as a function of the intended application, and can be tailored to optimize the overall system performance. It is also contemplated to pattern the surface of the aperture with a continuous or discontinuous pattern or network of low index coated areas, or provide the low index layer with a gradient in thickness or refractive index or both to modify the distribution of light output over the surface of the aperture. The aperture can also cover the entire top emitting surface 12a, where at least portions of the side surfaces 12c are covered with low refractive index layers.

Figure 2:
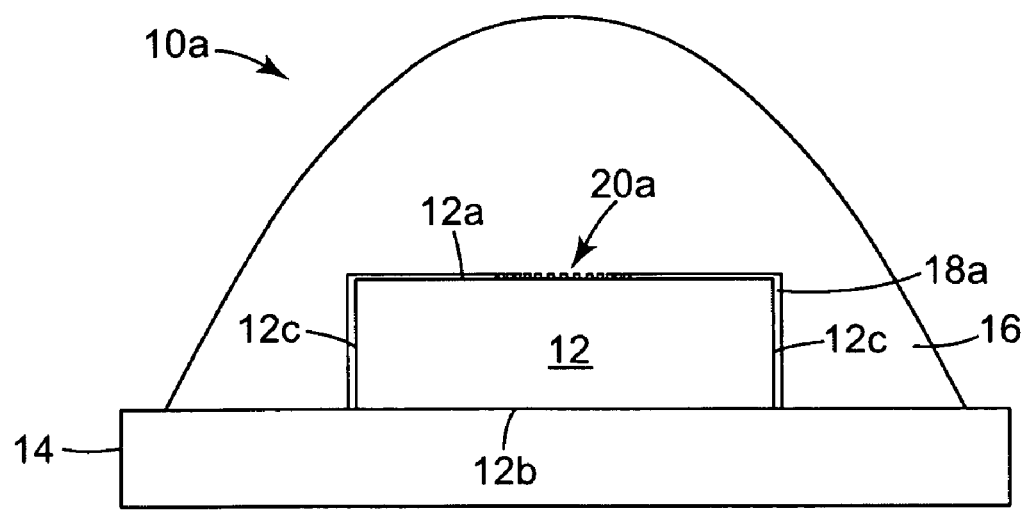

Turning to FIG. 2, an LED package 10a is shown there similar to LED package 10, but where low index layer 18 has been modified by including a network of low index coated areas within the central aperture. The modified low index layer is thus labeled 18a, and the modified central aperture is labeled 20a. Other elements retain the reference numbers used in FIG. 1. As shown, the network of low index areas can be arranged in a pattern that is relatively dense near the edges of the aperture so that transmission is relatively low in that region. The ability to tailor the transmission through the aperture is useful in high brightness LEDs where a specific spatial uniformity or output distribution is required for the system design. Such an arrangement of low refractive index medium within an aperture can likewise be applied to other disclosed embodiments, including without limitation the embodiments of FIGS. 3, 4, and 6-8.

The aperture can be coated with a low index material having a different thickness or different refractive index or both relative to the low index material defining the aperture (referred to as the "surrounding low index material" for convenience). Such design flexibility can be used to modify the angular distribution of light emitted by the packaged LED. For example, coating the aperture 20 or 20a with a material that has a refractive index between that of the optical element 16 and the surrounding low index material will restrict the range of angles of light emitted by the aperture. This will cause light that would ordinarily be emitted at high angles to be recycled within the LED die, and increase the output of light in a range of angles that can be more efficiently used by the associated optical system. For example, collection optics used in electronic projection systems do not efficiently use light that is outside the commonly used F/2 to F/2.5 acceptance design angles.

Figure 3:
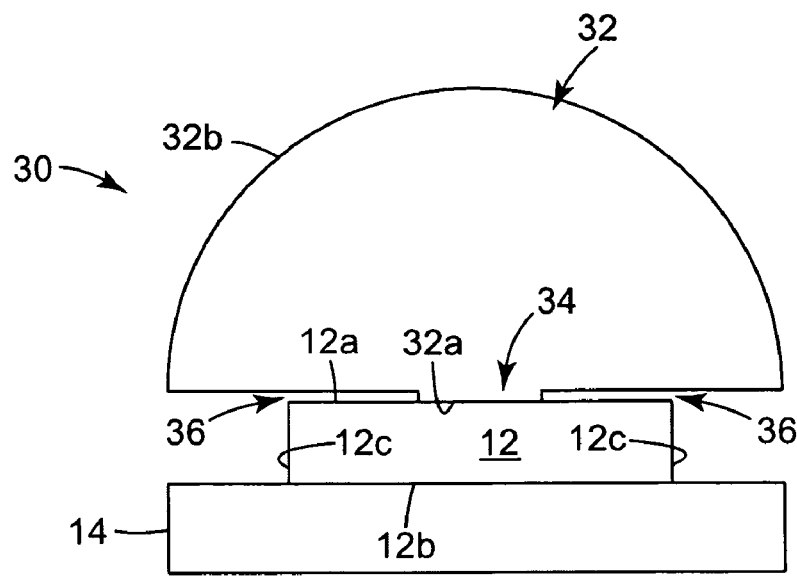
FIGS. 3 and 4 are schematic sectional views of more LED packages having brightness enhancing layers, and tapered optical elements.

Turning now to FIG. 3, an LED package 30 includes a transparent optical element 32 in partial optical contact with LED die 12 and partially spaced apart from the LED die to define a substantial air gap 34 therebetween. Transparent element 32 has an input surface 32a and an output surface 32b, the input surface 32a being: smaller than output surface 32b; smaller than emitting surface 12a of the LED die; and in optical contact with a portion of the emitting surface to define aperture 34. In this regard, the input surface is "smaller" than the output surface because it has a smaller surface area, and the output surface is accordingly larger than the input surface because it has a larger surface area. The difference in shape between the optical element 32 and the emitting surface 12a produces an air gap 36 which forms a patterned low refractive index layer around the area of contact (aperture 34). Light generated by the LED die can thus be efficiently extracted at the aperture 34 by the transparent element 32 with a high brightness. The optical element 32, and other optical elements disclosed herein, can be bonded to the LED die at the point of contact by any suitable means, or it can be held in position without being bonded to the LED die emitting surface. Further discussion regarding non-bonded optical elements in LED packages can be found in co-filed and commonly assigned U.S. patent application "LED Package With Non-Bonded Optical Element" Ser. No. 10/977,249, which is incorporated herein by reference in its entirety. As discussed above, the range of angles of light emitted by the LED emitting surface 12a into optical element 32 over the aperture 34 can be reduced by interposing a layer of material whose refractive index is between that of the LED die 12 and transparent element 32.

Figure 4:
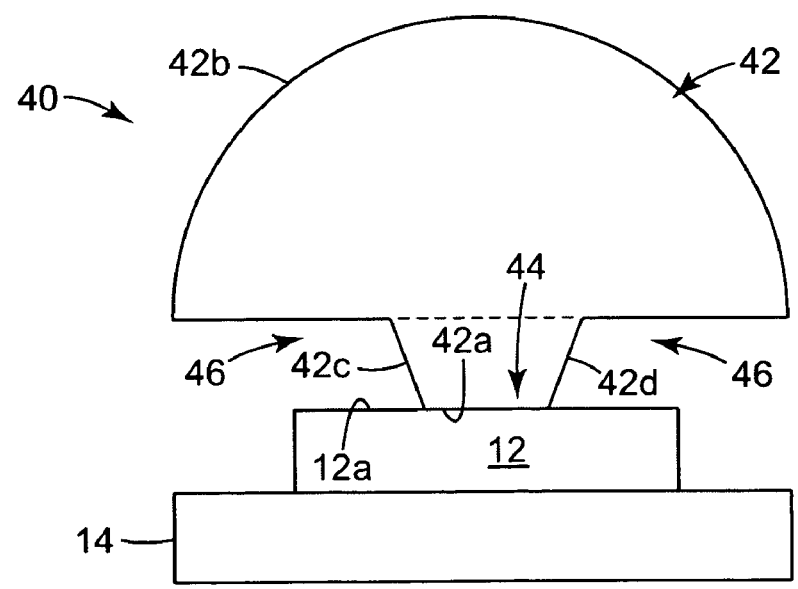

Another approach for reducing the range of angles of collected light—or for collimating (at least partially) the collected light—is to use a transparent element having one or more tapered side walls, as shown in FIG. 4. There, LED package 40 is similar to LED package 30, but optical element 42 is substituted for optical element 32. Element 42 has an input surface 42a and an output surface 42b, the input surface 42a being: smaller than output surface 42b; smaller than emitting surface 12a of the LED die; and in optical contact with a portion of the emitting surface to define aperture 44. The difference in shape between the optical element 42 and the emitting surface 12a produces an air gap 46 which forms a patterned low refractive index layer around the area of contact (aperture 44). Furthermore, optical element 42 includes tapered side surfaces 42c, 42d, which are reflective in order to collimate some of the highly oblique light entering input surface 42a from the LED die. Reflectivity of the side surfaces 42c, 42d can be provided by a low refractive index medium that supports TIR, or by application of a reflective material such as a metal layer or interference reflector, or combinations thereof.

The optical element 42 can be in optical contact with the emitting surface of the LED die through fluids, thermally bound inorganic glasses, plastic inorganic glasses, or by providing the surfaces with an optically smooth finish (surface roughness $R_A$ less than about 50 nm, preferably less than about 20 nm) and then holding the surfaces in close proximity to each other. Furthermore, optical element 42 can be compound in structure, where the lower tapered portion comprising surfaces 42a, 42c, 42d is made separately from the upper lens-shaped portion comprising surface 42b, and the two portions adhered or otherwise joined together by conventional means. The broken line is provided to show the two portions more clearly. More discussion of compound optical elements, design considerations, and associated benefits is provided below.

Figure 5:
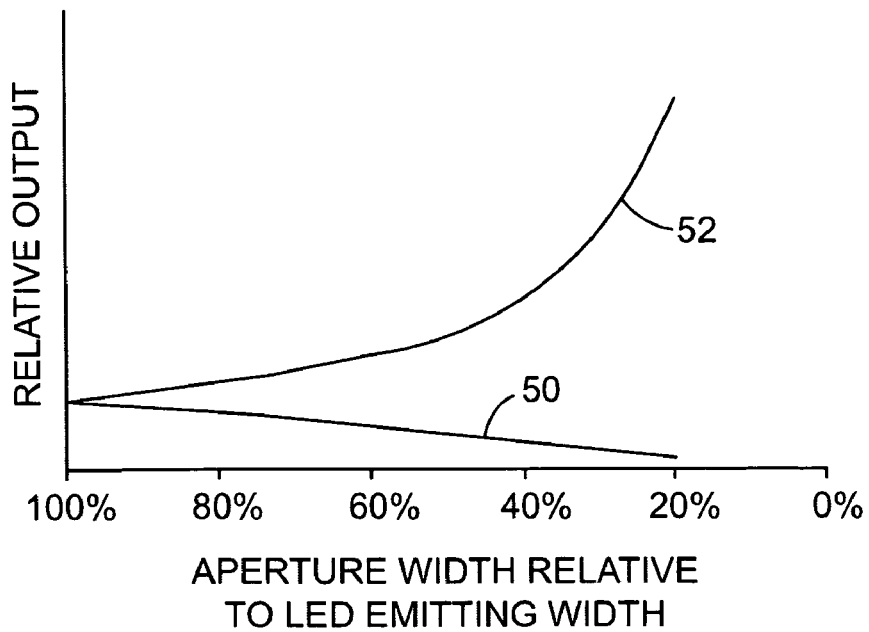
FIG. 5 is a graph showing modeled brightness and luminous output of an LED die as a function of the footprint size of the tapered element on the front emitting surface of the LED die.

A model was used to determine the potential increase in brightness for a packaged LED that utilized a patterned low index layer and a tapered optical element coupled to the output aperture. An LED was modeled with the material properties of silicon carbide (index 1.55) having an emitting region, an absorptive region, and angled edge facets such as to represent the optical behavior of a typical LED. An inverted truncated pyramid-shaped tapered optical element was optically coupled to the front facet or emitting surface of the LED. The material properties of the optical element were those of silicon carbide. The LED had a square shape as viewed from the front, as did the input and output surfaces of the optical element. The model further coupled the output surface of the optical element to a half-sphere lens with the material properties of BK7 glass, where the diameter of the lens was ten times the width of the square LED emitting surface, and the radius of curvature of the lens was five times the width of the LED emitting surface. The size of the input surface of the optical element, was incrementally changed from 100% of the LED emitting area to 4%, while keeping the aspect ratio of the height of the optical element 2.2 times the width of the output surface of the optical element, and keeping the width of the output surface 2 times the width of the input surface. As the size of the optical element became less than the size of the LED emitting surface, a medium of refractive index of 1 was assumed to cover the portion of the LED emitting surface outside of the optical element input surface, thus forming a low refractive index patterned layer that covered the LED emitting surface in complementary fashion to the optical element input surface. The fractional power emitted by the optical element (representative of the relative luminous output of the LED package) and the relative irradiance (lumen/(cm$^2$sr) emitted by the output surface of the optical element (representative of the relative brightness of the LED package) was calculated. FIG. 5 depicts in a general way the trend observed. Curve 50 is the relative fractional power emitted; curve 52 is the relative irradiance. The results confirm that as the aperture size decreases, less total luminous output is obtained from the package, but the brightness (in the smaller aperture) can increase dramatically.

The patterned low index layer of disclosed embodiments can comprise a gap or a coating of low index material applied to the LED die. Suitable methods for coating the LED die with a low index material—or with individual layers that will form an interference reflector—from a liquid include spin coating, spray coating, dip coating, and dispensing the coating onto the die. Liquid coatings can be composed of monomers that are subsequently cured, solvents, and polymers, inorganic glass forming materials, sol gels, and Aerogels. Suitable methods of coating the low index material from a gas state include chemical vapor deposition or condensing a vapor on the die. The die can also be coated with a low index material by sputtering, vapor deposition, or other conventional physical vapor deposition methods.

The coatings can be applied to a multitude of LEDs at the wafer level (before dicing), or after the wafer is diced but before mounting, after the die is mounted on the header or other support, and after electrical connections are made to the die. The aperture can be formed before or after the low index coating is applied. The choice of post-coating patterning method may depend on the particular low index material(s) chosen, and its compatibility with semiconductor processing. For example, a wafer can be covered with photoresist and patterned to create openings where the apertures are desired, a suitable low index coating deposited, and then liftoff performed using suitable solvent. Alternatively, a low index material can be deposited first over the entire wafer or die, a patterned photoresist layer can be applied as an etch mask, and the low index material removed using a suitable technique such as reactive ion etching. The photoresist layer can optionally be stripped using a suitable solvent. Other techniques for patterning the low index material include laser ablation and shadow masking, which may be particularly useful with materials that are soluble in typical photolithography stripping or development solvents. Suitable methods for lifting the unwanted coating off of the low adhesion areas include first applying a bonding material and then removing the bonding material, where the bonding material is able to remove the coating from the aperture area but allow the surrounding coating to remain intact. Low index coatings can also be patterned to form areas where electrical connections can be made to the die. See, for example, U.S. Patent Publication US 2003/0111667 A1 (Schubert), incorporated herein by reference.

Metal reflective layers can be applied by conventional processes, and patterned as needed to provide an aperture and appropriate electrical isolation.

Figure 6:
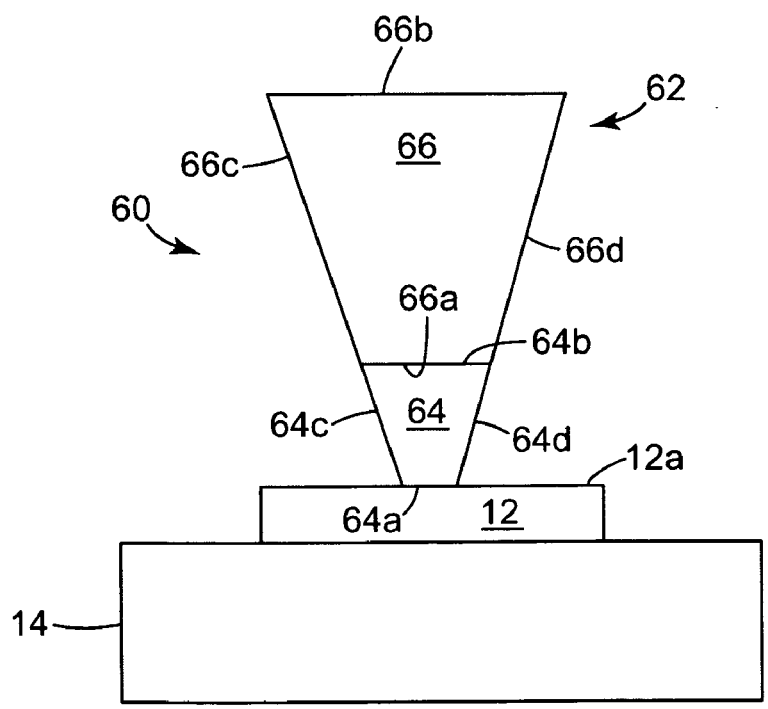
FIGS. 6, 7, and 8 are schematic sectional views showing LED packages utilizing compound taper elements, and wherein FIG. 8 further shows multiple taper elements coupled to an LED die.

Turning now to FIG. 6, we see there an LED package 60 that utilizes a tapered optical element 62 to couple light out of the LED die 12. As discussed in connection with optical element 42 of FIG. 4, optical element 62 also has a compound construction, i.e., it comprises at least two sections 64, 66 joined together. The sections have input surfaces 64a, 66a, output surfaces 64b, 66b, and reflective side surfaces 64c, 64d, 66c, 66d as shown. The tapered side surfaces of element 62 redirect or collimate (at least partially) light from closely positioned LED emitting surface 12a in a non-imaging way. With tapered element 62 and other tapered elements disclosed herein, the side surfaces need not be planar. They can be conical, curved (including parabolic) or any suitable combination depending on the intended application and design constraints. The disclosed taper elements can have the shape of elements known in the art as CPCs ("compound" parabolic concentrators).

It is desirable in many situations to form the optical tapered element from high refractive index materials to reduce reflections at the LED emitting surface 12a over the aperture defined by input surface 64a, so that light is more efficiently coupled out of, or extracted from, the LED die 12. It is also desirable in many situations to fabricate the optical element using a material having high thermal conductivity and high thermal stability. In this way, the optical element can perform not only an optical function but a thermal management function as well. Further thermal management benefits can be gained by thermally coupling such an optical element to a heat sink, as is described in more detail in co-filed and commonly assigned U.S. patent application "LED Package With Front Surface Heat Extractor" Ser. No. 10/977,241, which is incorporated herein by reference in its entirety.

Unfortunately, transparent materials that have sufficiently high refractive indices at the LED emission wavelength, e.g., greater than about 1.8, 2.0, or even 2.5, and/or that have thermal conductivities greater than about 0.2 W/cm/K, tend to be expensive and/or difficult to fabricate. Some of the relatively few materials that have both high refractive index and high thermal conductivity include diamond, silicon carbide (SiC), and sapphire ($Al_2O_3$). These inorganic materials are expensive, physically very hard, and difficult to shape and polish to an optical grade finish. Silicon carbide in particular also exhibits a type of defect called a micropipe, which can result in scattering of light. Silicon carbide is also electrically conductive, and as such may also provide an electrical contact or circuit function. Scattering within optical tapered elements may be acceptable if the scattering is limited to a position near the input end of the element. However, it would be expensive and time consuming to make a tapered element with sufficient length to efficiently couple light from an LED die. An additional challenge in making one-piece tapered elements is that the material yield may be relatively low, and the form-factor may force the LED die to be individually assembled with the tapered element. For these reasons, it can be advantageous to divide the tapered element into at least two sections, the sections being made of different optical materials, to reduce manufacturing cost.

A first section desirably makes optical contact with the LED die, and is made of a first optical material having a high refractive index (preferably about equal to the LED die refractive index at the emitting surface), high thermal conductivity, and/or high thermal stability. In this regard, high thermal stability refers to materials having a decomposition temperature of about 600° C. or more.

A second section is joined to the first section and is made of a second optical material, which may have lower material costs and be more easily fabricated than the first optical material. The second optical material may have a lower refractive index, lower thermal conductivity, or both relative to the first optical material. For example, the second optical material can comprise glasses, polymers, ceramics, ceramic nanoparticle-filled polymers, and other optically clear materials. Suitable glasses include those comprising oxides of lead, zirconium, titanium, and barium. The glasses can be made from compounds including titanates, zirconates, and stannates. Suitable ceramic nanoparticles include zirconia, titania, zinc oxide, and zinc sulfide.

A third section composed of a third optical material can be joined to the second section to further aid in coupling the LED light to the outside environment. In one embodiment the refractive indices of the three sections are arranged such that $n_1 > n_2 > n_3$ to minimize overall Fresnel surface reflections associated with the tapered element.

Oversized lens elements, such as the upper portion of optical element 42 shown in FIG. 4, can be advantageously placed or formed at the output end of disclosed simple or compound tapered elements. Antireflection coatings can also be provided on the surface(s) of such lens elements and/or on input and output surfaces of disclosed optical elements, including tapered or other collimating elements.

In an exemplary arrangement, the LED die 12 can comprise a 1 mm×1 mm GaN junction on a 0.4 mm thick slab of SiC. The first section 64 of the tapered element 62 can be composed of SiC. The second section 66 can be composed of LASF35, a non-absorbing, non-scattering high index glass having n=2.0. The width dimensions of the junction between the first and second sections and the output dimensions of the second section can be selected as desired to optimize total light output into the surrounding environment, of refractive index 1.0. The edges of the 0.4 mm thick SiC slab can be tapered at a 12 degree negative slope to completely frustrate TIR modes of light reflection at the side surfaces of the LED die. This slope can be tailored as desired, since the absorption and scattering within the LED junction and SiC slab will change the integrated mode structure compared to a standard encapsulated LED. For example, it may be desirable to use a positive slope (where the width of the LED junction is less than the width of the SiC slab) in order to direct optical modes away from the absorbing junction. The SiC slab may, in this manner, be considered as part of the tapered element.

The first section 64 can be coupled to a thermal heat sink as mentioned previously. The second section 66 can be bonded to the first section 64 using conventional bonding techniques. If a bonding material is used, it can have a refractive index between the two optical materials being joined in order to reduce Fresnel reflections. Other useful bonding techniques include wafer bonding techniques known in the semiconductor wafer bonding art. Useful semiconductor wafer bonding techniques include those described in chapters 4 and 10 of the text "Semiconductor Wafer Bonding" by Q.-Y. Tong and U. Gösele (John Wiley & Sons, New York, 1999). Wafer bonding methods described U.S. Pat. No. 5,915,193 (Tong et al.) and U.S. Pat. No. 6,563,133 (Tong) may also be used.

Figure 7:
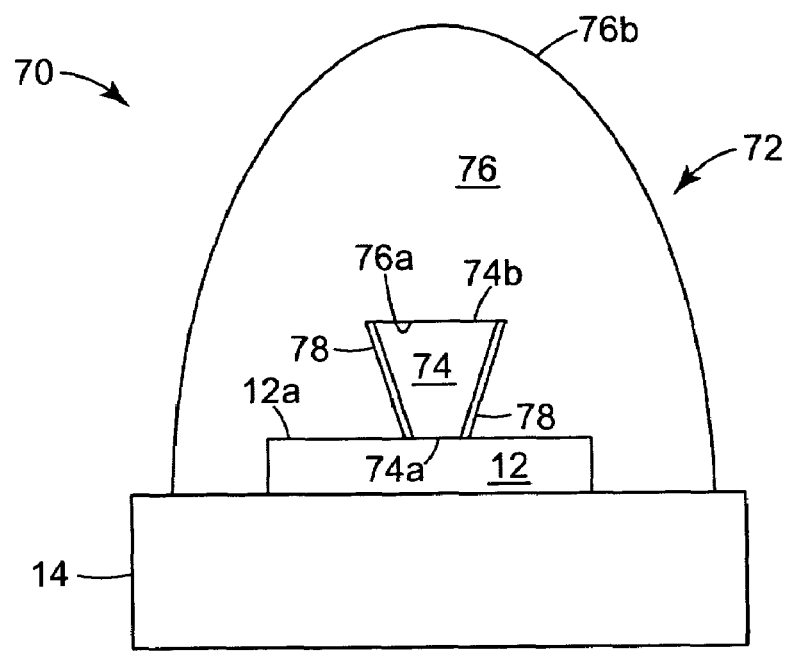
Figure 8:
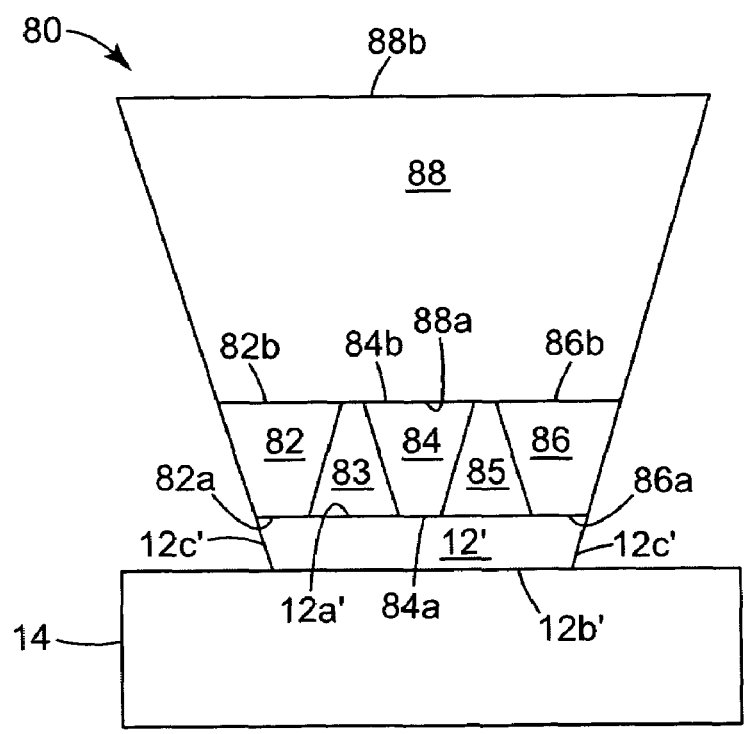

The LED package 70 shown in FIG. 7 utilizes a compound tapered element 72 in which a first section 74, having an input surface 74a connected to a larger output surface 74b by tapered reflective side walls, is encapsulated in a second section 76, which also has an input surface 76a (coextensive with output surface 74b) and an even larger output surface 76b. The output surface 76a is curved to provide the compound element 72 with optical power useful for further collimation or focusing. The tapered side surfaces of section 74 are shown with a coating 78 of low refractive index material to promote TIR at such surfaces. The material preferably has a refractive index lower than that of first section 74, second section 76, and LED die 12. Such coating 78 can also be applied to the portion of emitting surface 12a not in contact with section 74, and/or to the side surfaces 12c (see FIG. 1) of LED die 12. In constructing LED package 70, first section 74 can be bonded to (or simply placed upon) the desired aperture zone of emitting surface 12a, and a precursor liquid encapsulating material can be metered out in sufficient quantity to encapsulate the LED die and the first section, followed by curing the precursor material to form the finished second section 76. Suitable materials for this purpose include conventional encapsulation formulations such as silicone or epoxy materials. The package can also include a heat sink coupled to the sides of first section 76 through coating 78. Even without such a heat sink, use of a high thermal conductivity first section of the tapered element can add significant thermal mass to the LED die, providing some benefit at least for pulsed operation using a modulating drive current.

Both simple tapered elements and compound tapered elements disclosed herein can be manufactured by conventional means, such as by fabricating the tapered components individually, bonding a first segment to the LED die, and then adding successive segments. Alternatively, simple and compound tapered elements can be manufactured using precision abrasive techniques disclosed in co-filed and commonly assigned U.S. patent application "Process For Manufacturing Optical And Semiconductor Elements", Ser. No. 10/977,239, and U.S. patent application "Process For Manufacturing A Light Emitting Array", Ser. No. 10/977,240, both of which are incorporated herein by reference in their entirety. Briefly, a workpiece is prepared that contains one or more layers of the desired optical materials. The workpiece can be in a large format, such as wafers or fiber segments. A precisely patterned abrasive is then brought into contact with the workpiece so as to abrade channels in the workpiece. When abrasion is complete, the channels define a multiplicity of protrusions, which can be in the form of simple or compound tapered elements. The tapered elements can be removed individually from the workpiece and bonded one-at-a-time to separate LED dies, or an array of tapered elements can conveniently be bonded to an array of LED dies.

When optical coupling elements whose input surfaces are smaller than the emitting surface of the LED die are used, it becomes possible to consider coupling multiple such elements to different portions of the same emitting surface.

Advantageously, such an approach can be used to reduce the quantity of optical material necessary to couple a given amount of light out of the LED die, by simply replacing a single optical taper element with a plurality of smaller ones. The difference in material usage can be particularly important when dealing with expensive and difficult-to-work-with materials such as diamond, SiC, and sapphire. For example, replacing a single optical tapered element with a 2×2 array of smaller optical tapered elements can reduce the required thickness for the high index (first) optical material by a factor of more than 2, and a 3×3 array can reduce the required thickness by a factor of more than 3. Surprisingly, even though light may not be efficiently emitted from the LED in places between the input surfaces of the optical elements, modeling shows that this approach still has a very high net extraction efficiency.

Another advantage of using multiple optical coupling elements such as tapered elements is that gaps or spaces are formed between the elements that can be utilized for various purposes. For example, the gaps or spaces can be filled with high refractive index fluids, metal heat conductors, electrical conductors, thermal transport fluids, and combinations thereof.

Modeling was performed on an LED package in which the LED die was constructed of SiC and an absorbing layer adjusted such that 30% of the light generated within the LED die was emitted from the LED when immersed in a 1.52 refractive index medium. This is representative of typical LED devices. The model used a 3×3 array of optical tapered elements coupled to the LED emitting surface as shown in the LED package 80 of FIG. 8. The LED die 12' shown there has angled side surfaces 12c' and front emitting surface 12a', to which three of the optical tapered elements 82, 84, 86 are shown coupled at their input surfaces 82a, 84a, 86a respectively. Note the spaces or gaps 83, 85 formed between the smaller optical elements. The output surfaces 82b, 84b, 86b couple to an input surface 88a of larger optical tapered element 88, which has output surface 88b. The model also used a hemispherical lens (not shown) that was oversized relative to taper element 88, with its flat surface attached to output surface 88b, the lens being made of BK7 glass (n=1.52). The tapered element 88 was modeled as being composed of LAS35 (n=about 2). The model then evaluated different optical materials for the smaller taper elements, and different materials for the ambient space surrounding the LED die, including gaps 83, 85.

The calculated output power (e.g. in Watts) of the modeled LED package is as follows as a function of the small tapered element optical material (designated "A" in the table) and the ambient material (designated "B" in the table)

|  |  | Optical material for "B" | | | |
|---|---|---|---|---|---|
|  |  | SiC | LASF35 | BK7 | Vacuum |
| Optical material for "A" | SiC | 0.821 | 0.814 | 0.775 | 0.754 |
|  | LASF35 | 0.826 | 0.771 | 0.701 | 0.665 |
|  | BK7 | 0.625 | 0.613 | 0.537 | 0.466 |

When these values are normalized to the power output of a system using a single SiC tapered element in place of the 3×3 array of smaller elements, the following results are obtained:

|  |  | Optical material for "B" | | | |
|---|---|---|---|---|---|
|  |  | SiC | LASF35 | BK7 | Vacuum |
| Optical material for "A" | SiC | 100% | 99% | 94% | 92% |
|  | LASF35 | 101% | 94% | 85% | 81% |
|  | BK7 | 76% | 76% | 65% | 57% |

These tables show that an optical tapered element does not have to be optically coupled over the full area of the LED emitting surface to efficiently extract light. The tables also show that the ambient volume between the small taper elements can have a low refractive index without causing a substantial reduction in extraction efficiency.

The ambient volume can be filled with a material to increase extraction efficiency. The filler material can be a fluid, an organic or inorganic polymer, an inorganic particle-filled polymer, a salt, or a glass. Suitable inorganic particles include zirconia, titania, and zinc sulfide. Suitable organic fluids include any that are stable at the LED operating temperature and to the light generated by the LED. In some cases, the fluid should also have a low electrical conductivity and ion concentration. Suitable fluids include water, halogenated hydrocarbons, and aromatic and heterocyclic hydrocarbons. The filler material can also serve to bond the optical tapered elements to the LED die.

At least a portion of the space between the optical elements can have metal applied to either distribute current to the LED die, or to remove heat from the LED die, or both. Since metals have measurable absorption of light, it can be desirable to minimize absorptive losses. This can be done by minimizing the contact area of the metal with the die, and reducing the optical coupling to the metal by introducing a low refractive index material between the metal and the die surface, the optical element, or both. For example, the contact area can be patterned with an array of metal contacts surrounded by low index material which are in electrical conduct with an upper metal layer. See e.g. the '667 Schubert publication referenced above. Suitable low index materials include a gas or vacuum, fluorocarbons such as fluorinert, available from 3M Company, St. Paul, Minn., water, and hydrocarbons. The metal can extend into a media surrounding the optical element where heat can be removed.

Fluids can also be provided between the tapered elements to remove additional heat. The array of optical tapered elements can be in a square array (e.g. 2×2, 3×3, etc.), a rectangular array (e.g. 2×3, 2×4, etc.), or a hexagonal array.

The individual optical tapered elements can be square, rectangular, triangular, circular, or other desired shape in cross-section at their input or output surfaces. The array can extend over the entire emitting surface of the LED, or beyond, or only over a portion thereof. The tapered elements can be attached to the LED emitting surface with a low softening temperature solder glass, a soft inorganic coating such as zinc sulfide, a high index fluid, a polymer, a ceramic filled polymer, or by providing the optical elements and LED with very smooth and flat surfaces, and mechanically holding the die against the input surfaces of the optical elements.

Figure 9:
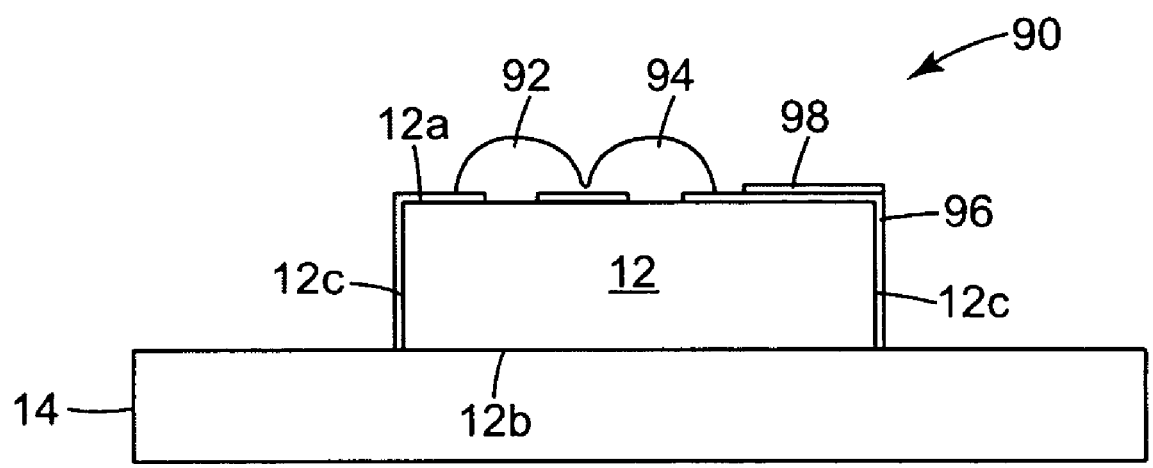
FIG. 9 is a schematic sectional view of another LED package having a brightness enhancing layer and multiple optical elements.

Another LED package 90 having multiple optical elements 92, 94 and a patterned low index layer 96 is depicted in FIG. 9. The patterned low index layer 96 includes two apertures as shown over which optical elements 92, 94 are disposed in optical contact with emitting surface 12a of the LED die. Layer 96 is also in optical contact with LED die emitting surface 12a, as well as with LED die side surfaces 12c. LED package 90 further includes a metal contact 98 shown atop a portion of low index layer 96. Although not shown in FIG. 9, patterned layer 96 is also patterned in the vicinity of metal contact 98, and metal contact 98 desirably extends through holes in the layer 96 to provide electrical contact to LED die 12. A second electrical contact can be provided at another location on the LED die depending on the chip design.

Glossary of Selected Terms

"Brightness": the luminous output of an emitter or portion thereof per unit area and per unit solid angle (steradian).

"Light emitting diode" or "LED": a diode that emits light, whether visible, ultraviolet, or infrared. The term as used herein includes incoherent (and usually inexpensive) epoxy-encased semiconductor devices marketed as "LEDs", whether of the conventional or super-radiant variety.

"LED die": an LED in its most basic form, i.e., in the form of an individual component or chip made by semiconductor wafer processing procedures. The component or chip can include electrical contacts suitable for application of power to energize the device. The individual layers and other functional elements of the component or chip are typically formed on the wafer scale, the finished wafer finally being diced into individual piece parts to yield a multiplicity of LED dies.

Various modifications and alterations of the invention will be apparent to those skilled in the art without departing from the spirit and scope of the invention. It should be understood that the invention is not limited to illustrative embodiments set forth herein.

What is claimed is:

1. A light source, comprising:
   an LED die having an emitting surface; and
   a collimating optical element having an input surface and an output surface, the input surface being in optical contact with only a portion of the emitting surface;
   wherein the optical element comprises a first portion that comprises the input surface and that is composed of a first material;
   wherein the optical element comprises a second portion that comprises the output end and that is composed of a second material;
   wherein the first material has a refractive index of at least 1.8, the refractive index of the first material being greater than a refractive index of the second material.

2. The light source of claim 1, wherein the first portion has a thermal conductivity greater than that of the second material.

3. A light source, comprising:
   an LED die having an emitting surface; and
   a collimating optical element having an input surface and an output surface, the input surface being in optical contact with only a portion of the emitting surface;
   wherein the optical element comprises a first portion that comprises the input surface and that is composed of a first material;
   wherein the optical element comprises a second portion that comprises the output surface and that is composed of a second material;
   wherein the first material has a thermal conductivity greater than that of the second material.

4. The light source of either claim 1 or 3, wherein the first material is selected from the group of diamond, silicon carbide, and sapphire.

5. The light source of either claim 1 or 3, wherein the output surface is curved.

6. The light source of either claim 1 or 3, wherein the output surface is larger than the input surface.

7. The light source of either claim 1 or 3, wherein the optical element comprises at least one reflective side surface between the input and output surfaces.

8. The light source of claim 7, further including a reflection-enhancing coating disposed on the at least one reflective side surface.

9. The light source of claim 8, wherein the reflection-enhancing coating comprises a material whose refractive index is about 1.4 or less.

* * * * *